(12) United States Patent
Iff

(10) Patent No.: US 11,959,737 B2
(45) Date of Patent: *Apr. 16, 2024

(54) METHOD AND A SYSTEM FOR COMBINED CHARACTERISATION OF STRUCTURES ETCHED IN A SUBSTRATE

(71) Applicant: UNITY SEMICONDUCTOR, Montbonnot-Saint-Martin (FR)

(72) Inventor: Wolfgang Alexander Iff, Domène (FR)

(73) Assignee: UNITY SEMICONDUCTOR, Montbonnot-Saint-Martin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/319,103

(22) Filed: May 17, 2023

(65) Prior Publication Data

US 2023/0375333 A1 Nov. 23, 2023

(30) Foreign Application Priority Data

May 19, 2022 (EP) .................................... 22305744

(51) Int. Cl.
  *G01B 11/22* (2006.01)
  *G01B 9/02* (2022.01)
  (Continued)

(52) U.S. Cl.
  CPC ............ *G01B 11/22* (2013.01); *G01B 9/0203* (2013.01); *G01B 9/02038* (2013.01);
  (Continued)

(58) Field of Classification Search
  CPC .............. G01B 9/0203; G01B 9/02063; G01B 9/02069; G01B 9/0209; G01B 11/028; G01B 11/22; G01B 9/02067
  See application file for complete search history.

(56) References Cited

U.S. PATENT DOCUMENTS

| 2011/0001988 A1* | 1/2011 | Pahk .................. G01B 11/0625 356/630 |
| 2013/0038863 A1 | 2/2013 | Fresquet |

(Continued)

FOREIGN PATENT DOCUMENTS

| WO | 2007042676 A1 | 4/2007 |
| WO | 2012100030 A2 | 7/2012 |

OTHER PUBLICATIONS

Search Report received for European Application No. 22305744.9, dated Oct. 17, 2022.

*Primary Examiner* — Michael A Lyons
(74) *Attorney, Agent, or Firm* — Greer, Burns & Crain, Ltd

(57) ABSTRACT

A method and system implementing the method for characterising structures etched in a substrate, such as a wafer, includes at least one structure etched in the substrate, an imaging step including the following steps: capturing, with an imaging device positioned on the top surface of the substrate, at least one image of a top surface of the substrate, and measuring a first data relating to the structure from at least one captured image, at least one interferometric measurement step, carried out with a low-coherence interferometer positioned on the top surface, for measuring with a measurement beam positioned on the structure, at least one depth data relating to a depth of the structure; and a first adjusting step for adjusting the measurement beam according to the first data.

13 Claims, 3 Drawing Sheets

(51) Int. Cl.
*G01B 9/02015* (2022.01)
*G01B 9/02055* (2022.01)
*G01B 9/0209* (2022.01)
*G01B 11/02* (2006.01)
*H01L 21/66* (2006.01)

(52) U.S. Cl.
CPC ..... *G01B 9/02063* (2013.01); *G01B 9/02069* (2013.01); *G01B 9/0209* (2013.01); *G01B 11/028* (2013.01); *H01L 22/12* (2013.01)

(56) References Cited

U.S. PATENT DOCUMENTS

| | | | |
|---|---|---|---|
| 2015/0228069 A1* | 8/2015 | Fresquet | G01N 21/9501 348/87 |
| 2015/0243024 A1 | 8/2015 | Fresquet et al. | |
| 2022/0136822 A1* | 5/2022 | Fresquet | G01M 3/20 356/498 |
| 2022/0357236 A1* | 11/2022 | Courteville | G01B 11/2441 |
| 2022/0397392 A1* | 12/2022 | Courteville | G01B 9/0209 |

* cited by examiner

METHOD AND A SYSTEM FOR COMBINED CHARACTERISATION OF STRUCTURES ETCHED IN A SUBSTRATE

BACKGROUND

The present invention relates to a method for characterising structures, and in particular high aspect ratio, HAR, structures, etched in a substrate. It also relates to a system for carrying out such a method.

The field of the invention is the field of the inspection and the characterization of structures etched in a substrate, such as high aspect ratio structures, for example Through-Silicon Vias, TSV, or trenches, etched in a substrate, such as a wafer for example.

In the semiconductor industry, or the MEMs (for "Microelectromechanical systems") industry for instance, many process steps involve etching structures with sometimes high aspect ratio, HAR, in substrates such as silicon. Such a HAR structures may be for instance Through Silicon Vias (TSVs) which are usually blind holes used for example for interconnections in advanced packaging techniques, trenches with narrow width and elongated length, and more complex features. They may be done by Deep Radiative Ion Etching (Deep RIE) or photolithography techniques for instance.

The aspect ratio of a structure is defined by the ratio between the depth and a lateral dimension, also called "critical dimension" (CD) of the structure. Some HAR structures may have aspect ratio larger than 5, or 10 or 20, with lateral (critical) dimensions as narrow as 5 µm or less. Some non-limitative examples comprise TSVs in the form of cylindrical holes with diameter of 2-3 µm and depth of 40-50 µm, etched in silicon substrates.

There is a need to measure and characterize these structures, and in particular HAR structures by measuring for instance their depth. The document WO 2007/042676 describes a technique for depth measurement of a HAR structure during deep RIE process. This technique has however some limitations for measuring HAR structure with very small critical dimensions (4 µm or less, for example). There are also known techniques for characterizing dense arrays of HAR structures. These techniques cannot be used to characterize a HAR structure individually.

A purpose of the present invention is to overcome at least one of the drawbacks of the known techniques.

Another purpose of the invention is to provide a solution to characterize etched structures, and in particular HAR structures, individually.

Another purpose of the invention is to provide a solution to characterize etched structures, and in particular HAR structures, of small critical dimension.

Another purpose of the invention is to provide a solution to measure depth and critical dimension of etched structures, and in particular HAR structures.

It is also a purpose of the present invention to provide a solution to characterize structures, and in particular HAR structures, more efficiently and/or faster.

SUMMARY

The invention makes it possible to achieve at least one of these aims by a method for characterising structures, and in particular high aspect ratio, HAR, structures, etched in a substrate, such as a wafer, said method comprising, for at least one structure etched in said substrate:

at least one imaging step comprising the following steps:
- capturing, with an imaging device positioned on a top side of said substrate, at least one image of a top surface of said substrate, and
- measuring a first data relating to said structure from at least one captured image;

at least one interferometric measurement step, carried out with a low-coherence interferometer positioned on said top side, for measuring with a measurement beam positioned on said structure, at least one depth data relating to a depth of said structure;

wherein said method also comprises a first adjusting step for adjusting said measurement beam according to said at least one first data.

Thus, the present invention proposes adjusting the measurement beam, for example the position and/or the diameter of the measurement beam, used to measure the depth of a structure as a function of a first data previously measured for said structure from at least one image of said structure. The first data represents a valuable information regarding the structure, as it will be explained in the further. Then, as an advantageous feature, the present invention proposes using the first data, i.e. the information regarding the structure, for adjusting the measurement beam used by the interferometer for measuring the depth data of the structure. Thus, the interferometric measurement step may be realized faster, and allows a faster and a more efficient measurement of the depth of the structure.

Plus, the first data regarding the structure makes it possible to adapt the measurement beam to a single structure thus allowing characterization of the structures etched in a substrate individually, even for structures with small critical dimensions.

In the present document a "high aspect ratio structure" or "HAR structure" or "HARS" designate a structure with an aspect ratio greater than, or equal to, 5, or 10, or even 20.

For example, a HAR structure may be a Through Silicon Via (TSV), a trench, and a more complex feature, etched in a support such as a wafer. Some non-limitative examples comprise TSVs in the form of cylindrical holes with diameter of 2-3 µm and depth of 40-50 µm, etched in silicon substrates.

In the present document, the "top side", respectively "top surface", of a substrate corresponds to the side, respectively to the surface, of the substrate on which the HAR structure(s) is(are) etched.

According to some embodiments, the imaging step and the interferometric measurement step may be carried out through respective light paths having a common portion. In this case, the method according to the invention may also comprise synchronization, by a synchronization unit, of said imaging and interferometric measurement steps so that said steps are carried out sequentially, or in turn.

Such a method allows characterising structures etched in the substrate faster and with a less bulky and less expensive system than the systems of the prior art. Indeed, the imaging step and the interferometric measurement step may share common optical components, and both measurements may be carried out without the need to move the measurement system relative to the substrate between measurements.

But above all, the synchronization makes it possible to carry out the imaging step and the interferometric measurement step in turn so that none of these steps disturbs the other step. In other words, the interferometric measurement step may be carried out without disturbances that may be caused by the imaging step. Likewise, the imaging step may be carried out without the disturbances that the interferometric measurement step, and in particular the interferometric measurement beam, may cause to said imaging step. Thus, the imaging step may carry out more accurate imaging so that the first data may be determined in a more accurate fashion. Likewise, the interferometric measurement step may carry out more accurate interferometric measurement so that the depth data may be determined in a more accurate fashion.

The synchronization of the imaging and the interferometric measurement steps may be carried out in different ways, implemented alone or in combination.

According to some embodiments, the synchronization may be carried out by controlling a position of a shutter located between the interferometer and the common portion. This shutter may be movable between:
- a closed position blocking the passage of the measurement beam, and
- an open position authorizing the passage of said measurement beam.

When the imaging step is carried out the shutter may be moved to the closed position preventing the passage of the measurement beam: the latter doesn't disturb the imaging step. After the imaging step is carried out, the shutter may be moved to the open position authorizing the passage of the measurement beam so that the interferometric measurement may be carried out.

Alternatively, or in addition, the synchronization may be carried out by controlling a position of a mirror located between the interferometer and the common portion. This mirror may be movable between:
- a closed position deflecting the measurement beam away from the structure under inspection, and
- an open position directing said measurement beam towards said structure.

When the imaging step is carried out, the mirror may be moved to the closed position: the measurement beam is deflected away from the HAR structure, or even from the substrate. After the imaging step is carried out, the mirror may be moved to the open position deflecting the measurement beam towards the structure: interferometric measurement may be carried out.

Alternatively, or in addition with at least one of the previous synchronization options, the synchronization may be carried out by controlling a position of an optical filter such as a neutral density filter or a spectral filter located between the interferometer and the common portion. This filter may be movable between:
- a closed or a strongly attenuating position filtering the measurement beam, and
- an open position letting the measurement beam pass.

When the imaging step is carried out, the optical filter may be moved to the closed position: the measurement beam is filtered out, or strongly attenuated, and does not pass (at least significantly) towards the HAR structure. After the imaging step is carried out, the optical filter may be moved to the open position: the measurement beam passes said filter so that the interferometric measurement step may be carried out.

Alternatively, or in addition with at least one of the previous synchronization options, the synchronization may be carried out by controlling an attenuation value of an attenuating device located between the interferometer and the common light path portion, attenuating the measurement beam during the imaging step and not attenuating the measurement beam otherwise.

Alternatively, or in addition with at least one of the previous synchronization options, the synchronization may be carried out by switching on and off an interferometer light source. Thus, the light source may be switched off during the imaging step, and switched on for interferometric measurement step.

Alternatively, or in addition to at least one of the previous synchronization options, the synchronization may be carried out by triggering acquisition of image(s) by the imaging device with respect to the pulses of a pulsed light source of the interferometer such that image acquisition is carried out between the pulses of said source. In this case, the light source of the interferometer is a pulsed light source with a given frequency for the pulses, or with pulses triggered by the synchronization unit. The imaging device may be triggered between the pulses, or controlling the pulses, or being triggered by the synchronization unit along with the pulsed light source, so that at least one image is captured when the pulsed light source does not emit a pulse of light.

In some embodiments, for at least one structure, the first data relating to said structure may be deducted/calculated from a single image captured by the imaging device. Alternatively, or in addition, for at least one structure, the first data relating to said structure may be deducted from several images captured by the imaging device.

In some embodiments, for at least one structure, at least one image captured by the imaging device may relate only to said structure: in this case the captured image comprises information regarding only said structure and does not comprise information regarding any other structure.

Alternatively, or in addition, at least one image captured by the imaging device may relate to several, and in particular to all, structures of the substrate: in this case the captured image comprises information regarding each of said structures so that it is possible de determine the first data for each of said structures by processing said captured image. For example, it is possible to carry out an imaging step capturing an image of the substrate, before the first interferometric measurement step. The captured image may comprise the whole top surface of the substrate. Said captured image may then be processed to determine the first data for each structure of the substrate.

In some embodiments, for at least one structure, the first data may comprise a top-CD data relating to a width of said structure, the first adjusting step comprising an adjustment of a diameter of the measurement beam as a function of said top-CD data.

Thus, the imaging step provides the top-CD data, the latter being then used during the first adjusting step for adjusting the diameter of the measurement beam.

Thus, the method according to the invention allows faster and more accurate measurement of the depth of structures of a substrate, especially when the top-CD data of said structures are not known, and/or when the substrate comprises different structures with different top-CDs.

In these embodiments, the method according to the invention proposes adjusting, for at least one structure, or HAR structure, the diameter, on the top surface of the substrate, of the measurement beam emitted by the interferometer, according to a top-CD of the said structure previously measured during the imaging step. This allows to have most of the incident measurement beam entering the structure, and in particular a HAR structure, while only a small part of it is reflected at the top surface. Due to the rather small ratio of diameter or top-CD vs. illumination wavelengths (often below 15) which leads to strong diffraction effects, and often also due to absorbing properties of the involved materials, e.g. silicon, or more generally speaking due to the conditions of propagation of light into these structures, the losses inside these structures are high, and only a small part of the incoming light is reflected from the bottom of the structure and coupled back into the interferometer. So, the sensitivity of the interferometric measurements is optimized by using most of the incident power to compensate for the high losses, in particular in the HAR structures, and obtain more balanced interference signals.

The diameter of the measurement beam, on the top surface, may be adjusted for instance to be between 0.8 and 2 times the smallest transverse dimension of the structure, which can be for instance the diameter or the section of a TSV, or the width of a trench. It can also be adjusted to be between 0.3 or 0.5 and 5 times the smallest transverse dimension of the structure and still produce exploitable signals.

The diameter of the measurement beam may be for instance defined as the portion of the beam with 90% or 99% of the incoming power. With a Gaussian beam, the diameter of the measurement beam, on the top surface, may also be for instance defined as the portion of the beam with a local intensity higher than $1/e^2$ of the peak intensity, corresponding to 86.5% of the power.

This diameter can also be adjusted so that at least 75%, or 80%, or 90% of the incoming power is coupled into the structure.

As a matter of example, measurement beam diameter sizes of 5 µm diameter, or 3 µm, may be used to measure the structures, and in particular HAR structures, and in particular TSVs, of diameter 3 µm.

The optimum portion of light focused into the structure depends notably on the losses of light inside the structure and therefore the structure shape (e.g. its aspect ratio). Deeper and narrower HAR structures, for example TSVs or trenches, as well as HAR structures with strongly curved bottoms require the coupling of a large portion of the incoming power into them and therefore a small beam diameter whereas shallow or broad structures require only the coupling of a smaller portion of the incoming power into them. This is a reason for the choice of an adaptable beam size on the top surface of the substrate.

Another advantage of the adjustment of the size of the measurement beam is that the measurement beam is limited enough to cover only one structure, even for arrays of structures close to each other, which allows ensuring that the structures can be individually characterized.

In some embodiments, the method according to the invention may comprise a second adjusting step for adjusting the diameter of the measurement beam according to at least one characteristic of an interferometric signal measured by the interferometer.

The second adjusting step may be carried out during or after the first adjusting step.

The second adjusting step allows an adjustment of the diameter of the measurement beam, in particular during the measurement step, and allows adjustment of the measurement beam, especially in real condition and in real time, when the measured interferometric signal indicates that the diameter of the measurement beam is not adapted to the structure under inspection.

The at least one characteristic of the measured interferometric signal may comprise at least one of the following characteristics:
  a visibility, or a modulation depth, possibly relative to an average value, of interference fringes or a spectral modulation of the measured interferometric signal, and/or
  an amplitude relative to noise of the measured interferometric signal, and/or
  a value of depth data as provided by the interferometric signal.

Thus, if one of these characteristics has not an expected value, or has a value that is not in an expected range, this indicates that the diameter of the measurement beam is not adapted to the structure under inspection. The diameter of the measurement beam may be adjusted consequently.

Alternatively, or in addition, an optimization process may be carried out, for instance using a gradient-based algorithm, to find the diameter of the measurement beam for which at least one characteristic of the measured interferometric signal is optimized, or reaches a local extremum.

The adjustment of the diameter of the measurement beam on the top surface may be carried out in different ways, that may be implemented alone or in combination.

In some embodiments, the adjustment of the diameter, on the top surface, of the measurement beam may be carried out by changing at least one optical element, such as a lens or a beam expander, placed between the interferometer and the top surface. The changing of the optical element may be realized by any means. For example, the change of the optical element may be realized with a turret moving or supporting said at least one optical element.

Alternatively, or in addition, the adjustment of the diameter, on the top surface, of the measurement beam may be carried out by changing at least one focal length of an optical element, such as a lens or a zoom arrangement, placed between the interferometer and the top surface. The change of the focal length of the optical element may be carried out for instance by modifying the shape or the propagation properties of a deformable lens or a meta-lens, or by changing a magnification ratio of said optical element, or the position of a component of a zoom arrangement composing said optical element.

Alternatively, or in addition with at least one of the previous options, the adjustment of the diameter, on the top surface, of the measurement may be carried out by changing a numerical aperture of the measurement beam on the top surface. The numerical aperture of the measurement beam may be changed by using a beam expender in a collimated beam path or an aperture stop.

In some embodiments, for at least one structure, the first data may comprise a position data relating to a position of the structure on the top surface. In this case, the first adjusting step may comprise an adjustment of a position, on said top surface, of the measurement beam according to said position data.

Thus, the imaging step provides a data information relative to the position of the structure by processing at least one image captured, during the imaging step, by the imaging device. The position of said structure on the substrate is then used for faster and more accurate positioning of the measurement beam so that the measurement of the depth of structures of a substrate is carried out faster and more accurately compared to known techniques.

In some embodiments, the method according to the invention may comprise a third adjusting step for adjusting the position of the measurement beam relative to the structure according to at least one characteristic of an interferometric signal measured by the interferometer.

The third adjusting step may be carried out during or after the first adjusting step.

The third adjusting step allows an accurate adjustment of the position of the measurement beam during the measurement step, especially in real condition and in real time, so as to optimize the conditions of measurement of the depth data for the structure of interest.

The at least one characteristic of the measured interferometric signal may comprise at least one of the following characteristics:
- a visibility, or a modulation depth, possibly relative to an average value, of interference fringes or a spectral modulation of the measured interferometric signal,
- an amplitude relative to noise of the measured interferometric signal,
- a value of depth data as provided by the interferometric signal.

Thus, if one of these characteristics has not an expected value or has a value that is not in an expected range, this indicates that the position of the measurement beam with respect to the structure is not optimal. The position of the measurement beam may be adjusted consequently.

Alternatively, or in addition, an optimization process may be carried out, for instance using a gradient-based algorithm, to find the position of the measurement beam for which at least one characteristic of the measured interferometric signal is optimized, or reach a local extremum.

The adjustment of the position of the measurement beam on the top surface may be carried out in different ways, that may be implemented alone or in combination.

The position of the measurement beam may be adjusted by a positioning unit. The positioning unit may comprise a holder for the substrate, and/or a holder for the interferometer.

The position unit may adjust the position on the top surface, of the measurement beam, by:
- moving the interferometer with respect to the substrate; and/or
- moving the substrate with respect to the interferometer.

The invention also relates to a system for characterising structures, and in particular high aspect ratio, HAR, structures, etched in a substrate, such as a wafer, said system comprising
- an imaging arrangement comprising:
  - an imaging device, arranged on a top side of said substrate, for capturing at least one image of a top surface of said substrate, and
  - a processing unit for measuring a first data relating to a structure etched in said substrate from at least one captured image; and
- a low-coherence interferometer, arranged on said top side, for measuring with a measurement beam positioned on the structure at least one depth data relating to a depth of said structure;

characterized in that said system also comprises an adjustment unit for adjusting the measurement beam according to said first data.

In some embodiments, for at least one structure, the first data may comprise a top-CD data relating to a width of said structure. In this case, the adjustment unit may comprise means for adjusting the diameter, on the top surface, of the measurement beam.

Alternatively, or in addition, the diameter of the measurement beam may be adjusted according to at least one characteristic of the interferometric signal measured by the interferometer, as previously explained.

According to some non-limitative examples, the adjustment unit may comprise:
- a turret for changing at least one optical element, such as a lens or a beam expander, placed on the path of the measurement beam between the interferometer and the top surface;
- an optical element, such as a lens or a zoom lens, with adjustable focal length, placed on the path of the measurement beam between the interferometer and the top surface; and/or
- a beam expander with adjustable numerical aperture, placed on the path of the measurement beam between the interferometer and the top surface.

Alternatively, or in addition, for at least one structure, the first data may comprise a position data relating to a position of the structure on the top surface. In this case, the adjustment unit may further comprise a positioning unit for adjusting the position, on the top surface, of the measurement beam.

Alternatively, or in addition, the position of the measurement beam may be adjusted according to at least one characteristic of the interferometric signal measured by the interferometer, as previously explained.

The positioning unit may comprise a holder for the substrate, and/or a holder for the interferometer.

The positioning unit may adjust the position on the top surface, of the measurement beam, by:
- moving the interferometer with respect to the substrate; and/or
- moving the substrate with respect to the interferometer.

In some embodiments, respective light paths of the imaging arrangement and of the interferometer may have a common portion. In this case, the system according to the invention may also comprise a synchronization unit so that said imaging arrangement and said interferometer are used sequentially, or in turn.

For synchronizing the imaging arrangement and the interferometer, the synchronization unit may comprise at least one of the following:
- a shutter located between the interferometer and the common portion, and moveable between a first position blocking the passage of the measurement beam and a second position authorizing the passage of said measurement beam;
- a mirror located between the interferometer and the common portion, and moveable between a first position deflecting the passage of the measurement beam away from the structure and a second position deflecting said measurement beam towards said structure;
- an optical filter, such as a neutral density filter or a spectral filter, located between the interferometer and the common portion, and moveable between a first position filtering the measurement beam, so as to block it or attenuate it strongly, and a second position letting the measurement beam pass;
- an attenuating device, such as an electro-optic attenuator, located between the interferometer and the common light path portion, the attenuation value of which is controllable;
- a controller switching on and off an interferometer light source;
- a controller controlling the imaging device and/or the light source so as to trigger acquisition of image(s) by the imaging device with respect to the pulses of a pulsed light source of the interferometer such that image acquisition is carried out between the pulses of said source.

In some embodiments, the imaging arrangement may comprise a light source and a camera, optionally combined with a microscope optical arrangement.

In some embodiments, the interferometer is coupled to an optical fibre conveying the measurement beam and the reflected light. The optical fiber may be a single-mode fiber.

The interferometer may be for instance a time domain interferometer.

In that case, it comprises a broadband source (not shown) emitting a polychromatic light. It further comprises an optical delay line which allows varying an optical path difference between two beams. When the optical path difference between the beams reflected respectively at the top and the bottom of the structure, or between these respective beams and a reference beam, is reproduced by the delay line, an interference burst, or fringe, can be observed on a photodetector, allowing measuring this optical path difference. The depth of the structure is deducted from said optical path difference.

The interferometer may also be a spectral domain interferometer. In that case, it comprises a broadband source (not shown) emitting a polychromatic light, and a spectrometer for a spectral analysis of the reflected light. The spectrum obtained by combining the light reflected respectively by the top and the bottom of the structure on the spectrometer exhibit well known patterns such as modulation whose analysis can provide the optical path difference between the superposed beams. The depth of the structure is deducted from said optical path difference.

The interferometer may also comprise a swept source interferometer, with a tunable laser emitting a monochromatic light with an optical frequency varying temporally over a spectral range. The intensity of the reflected light is measured by a photodetector, so as to reconstitute a spectrum, whose analysis allows also to measure the optical path difference between the reflected beams, and with this the depth of the structure.

The interferometer may be for example similar to the one described in the document published under the number WO2007/042676.

BRIEF DESCRIPTION OF THE DRAWINGS

Other advantages and characteristics will become apparent on examination of the detailed description of an embodiment which is in no way limitative, and the attached figures, where.

DETAILED DESCRIPTION

It is well understood that the embodiments that will be described below are in no way limitative. In particular, it is possible to imagine variants of the invention comprising only a selection of the characteristics described hereinafter, in isolation from the other characteristics described, if this selection of characteristics is sufficient to confer a technical advantage or to differentiate the invention with respect to the state of the prior art. Such a selection comprises at least one, preferably functional, characteristic without structural details, or with only a part of the structural details if this part alone is sufficient to confer a technical advantage or to differentiate the invention with respect to the prior art.

In the FIGURES, elements common to several figures retain the same reference.

Figure 1:
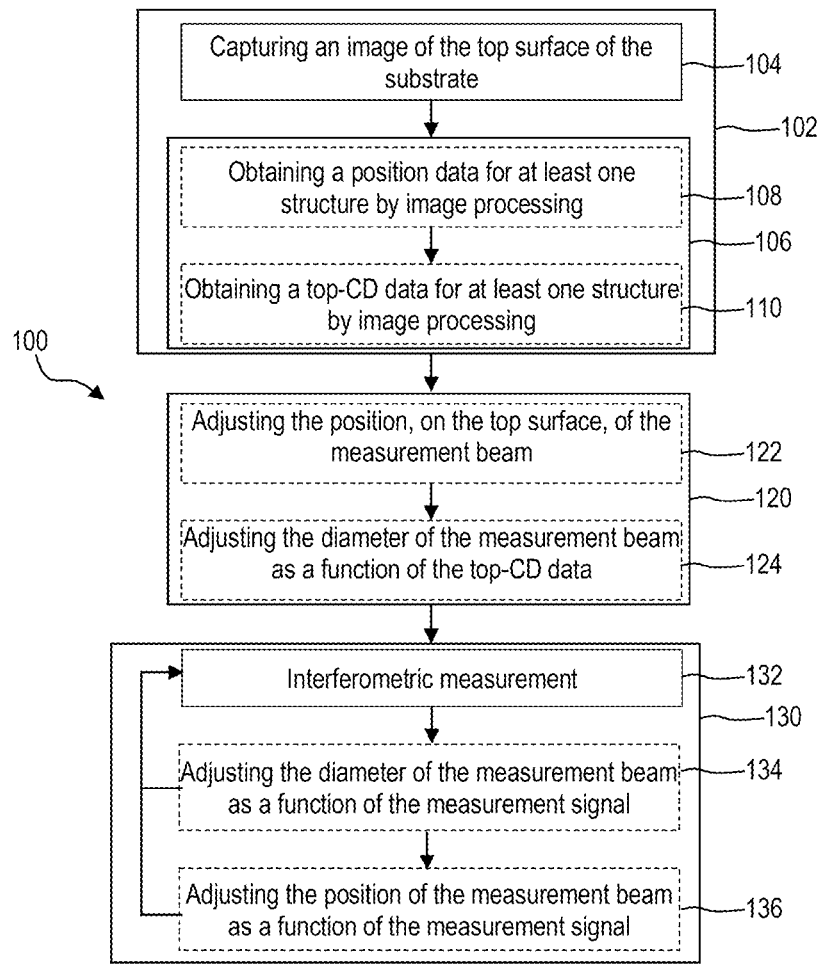
FIGS. 1 and 2 are diagrammatic representations of non-limitative examples of a method according to the invention.

FIG. 1 is a diagrammatic representation of a non-limitative example of a method according to the present invention.

The method 100, shown in FIG. 1, may be used to characterize structures, and in particular HAR structures, etched in a substrate, such as a wafer. More particularly, the method 100 of FIG. 1 may be used to measure the depth of structures etched in the substrate.

The method 100 comprises an imaging step 102 of the substrate.

The imaging step 102 comprises a step 104 for capturing at least one image of the top surface of the substrate, for example by an imaging arrangement. The imaging arrangement may comprise a camera, optionally associated with a microscope and a light source, for imaging the top surface of the substrate. The captured image may comprise the whole top surface or only a portion of said top surface. The captured image may comprise only one structure etched in the substrate, or several, in particular all of the, structures etched in the substrate.

The captured image may then be processed, at a processing step 106, for identifying a first data relative to at least one structure.

More particularly, the first data may comprise a position data relative to the position of at least one structure visible in the captured image. In this case, the processing step 106 may comprise a processing step 108 for processing of the image for determining the position data. Such a processing may be done according to commonly known image processing methods, using for instance segmentation, pattern recognition or blob analysis algorithms.

In addition, or alternatively, the first data may comprise a top-CD data relative to at least one structure visible on the captured image. In this case, the processing step 106 may comprise a processing step 110 for processing the captured image for determining the top-CD data. The processing of the image for determining the top-CD data may be done according to commonly known image processing methods. For instance, once a structure has been located and identified, its critical dimensions can be obtained by using a pattern analysis algorithm and an imaging system calibrated in magnification or in dimension.

In some embodiment only one of the processing steps 108 and 110 may be carried out. In some embodiments, both processing steps 108 and 110 may be carried out. In this latter case, processing steps 108 and 110 may be carried out during a single processing step.

The method 100 may comprise a first adjustment step 120 for adjusting the measurement beam according to the first data determined at the processing step 106.

The adjustment step 120 may comprise an adjustment step 122 for adjusting the position, on the top surface, of the measurement beam, according to the position data determined at step 108, so that the measurement beam is positioned accurately on the structure that is being characterized.

Alternatively, when the first data doesn't comprise a position data, said position data may be a priory-known data read from a memory. Indeed, in some cases, the position data of a structure etched in the substrate may be provided because said position data is determined during the design or the manufacturing of the substrate. In these cases, the position data may be stored in a memory and read during the method according to the invention.

In these embodiments, the adjustment step 122 may be done using said a prior-known position data read from a memory.

The position of the measurement beam on the top surface may be adjusted with a positioning unit. The positioning unit may comprise:

a displacement stage for the interferometer and possibly the imaging arrangement, arranged to move at least the interferometer with respect to the plane of the top surface of the substrate, and/or a displacement stage for the substrate, arranged to move said substrate, or the chuck maintaining the substrate, with respect to the interferometer and possibly the imaging arrangement.

Again, steps 108 and 122 are optional so that in some embodiments the method according of the invention may not comprise these steps, or may comprise only the adjustment step 122 carried out with a position data read from a memory.

The first adjustment step 120 may comprise an adjustment step 124 for adjusting the diameter of the measurement beam on the surface of the substrate, according to a top-CD data, and in particular according to the top-CD data determined at step 110. The diameter of the measurement beam may be adjusted in order to make sure that the measurement beam enters the structure and reaches the bottom of the structure with enough power, in particular for HAR structures, in order to measure the depth of the structure.

Alternatively, when the first data doesn't comprise a top-CD data, said top-CD data may be a priory-known data read from a memory. Indeed, in some cases, the top-CD data of a structure etched in the substrate may be provided because said top-CD data is determined during the design or the manufacturing of the substrate. In these cases, the top-CD data may be stored in a memory and read during the method according to the invention. In these embodiments, the adjustment step 124 may be done using said a priory-known top-CD data read from a memory.

The adjustment of the diameter, on the top surface, of the measurement beam may be carried out by changing at least one optical element, such as a lens or a beam expander, placed between the interferometer and the top surface. The changing of the optical element may be realized by any means. For example, the change of the optical element may be realized with a turret moving or supporting said at least one optical element.

Alternatively, or in addition, the adjustment of the diameter, on the top surface, of the measurement beam may be carried out by changing at least one focal length of an optical element, such as a lens or a zoom arrangement, placed between the interferometer and the top surface. The change of the focal length of the optical element may be carried out for instance by modifying the shape or the propagation properties of a deformable lens or a meta-lens, or by changing a magnification ratio of said optical element, or the position of a component of a zoom arrangement composing said optical element.

Alternatively, or in addition with at least one of the previous options, the adjustment of the diameter, on the top surface, of the measurement may be carried out by changing a numerical aperture of the measurement beam on the top surface. The numerical aperture of the measurement beam may be changed by using a beam expender in a collimated beam path or an aperture stop.

Again, steps 110 and 124 are optional so that in some embodiments the method according of the invention may not comprise these steps, or may comprise only the adjustment step 124 carried out with a top-CD data read from a memory.

The method 100 comprises, after the first adjustment step 120, for at least one structure, an interferometric measurement step 130 during which a depth data relating to the depth of said structure is measured by optical interferometry.

The interferometric measurement is carried out by a low coherence optical interferometer arranged on the top side of the substrate. Optical interferometry is a well-known technique and therefore will not be described in detail here. In short, a measurement beam of broadband light is sent to the structure. At least part of said measurement beam is reflected by the structure, respectively at the top or the surface of the substrate, and at the bottom of the structure. The reflected beams are made to interfere with each other or with a reference beam issued from the same source, to obtain an interference signal whose analysis provides the depth data.

The measurement step 130 comprises at least one interferometric measurement 132 providing a measurement signal as explained above. This measurement signal may then be processed to obtain the depth data.

The method 100 may optionally comprise a second adjustment step 134, especially during the measurement step 130, for adjusting the diameter of the measurement beam according to at least one characteristic of the interferometric signal measured by the interferometer. This second adjustment step 134 allows real time adjustment of the diameter of the measurement beam as a function of the measured signal. For example, the diameter of the measurement beam may be adjusted as a function of:

a visibility or a modulation depth, possibly relative to an average value, of interference fringes or a spectral modulation of the measured interferometric signal;

an amplitude relative to noise of the measured interferometric signal; and/or a value of depth data as provided by the interferometric signal.

Thus, if one of these characteristics has not an expected value, or has a value that is not in an expected range of values, this indicates that the diameter of the measurement beam is not adapted to the structure under inspection. The diameter of the measurement beam may be adjusted consequently as explained later. The process may be repeated iteratively, using for instance a gradient-based algorithm, to find the diameter of the measurement beam for which at least one characteristic of the measured interferometric signal is optimized, or reach a local extremum.

The method 100 may optionally comprise a third adjustment step 136, especially during the measurement step 130, for adjusting the position of the measurement beam according to at least one characteristic of the interferometric signal measured by the interferometer. This third adjustment step 136 allows real time adjustment of the position of the measurement beam as a function of the measured signal. For example, the position of the measurement beam may be adjusted as a function of:

a visibility or a modulation depth, possibly relative to an average value, of interference fringes or a spectral modulation of the measured interferometric signal; and/or an amplitude relative to noise of the measured interferometric signal; and/or a value of depth data as provided by the interferometric signal.

Thus, if one of these characteristics has not an expected value, or has a value that is not in an expected range of values, this indicates that the position of the measurement beam with respect to the structure is not optimal. The position of the measurement beam with respect to the structure may be adjusted consequently, as explained later. The process may be repeated iteratively, using for instance a gradient-based algorithm, to find the position of the measurement beam for which at least one characteristic of the measured interferometric signal is optimized, or reach a local extremum.

The second adjusting step 134 and the third adjusting step 136 may be executed simultaneously, or sequentially, in any order. Alternatively, only one, or none, of the steps 134 and 136 may be executed. After at least one of these steps is carried out, at least one another interferometric measurement step 132 may be carried out. The interferometric measurement step 132 may thus be repeated until the interferometric measurement is successful.

Figure 2:
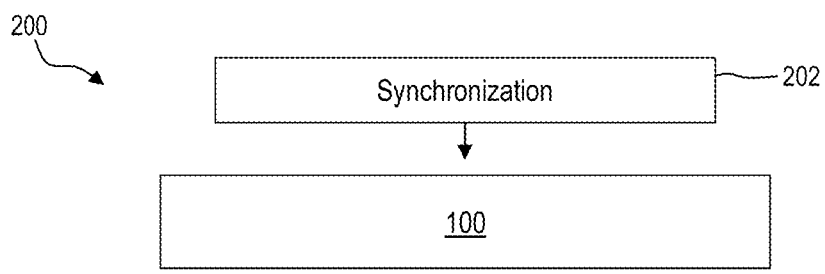

FIG. 2 is a diagrammatic representation of another non-limitative example of a method according to the present invention.

The method 200, shown in FIG. 2, may be used to characterise structures, and in particular HAR structures, etched in a substrate, such as a wafer. More particularly, the method 200 of FIG. 2 may be used to measure the depth of structures etched in the substrate.

The method 200 comprises the steps of the method 100 described with reference to FIG. 1.

The method 200 further comprises a synchronization step 202 so that the capturing step 104 and the interferometric measurement step 132 are carried out in turn so that said steps do not disturb each other. In particular, the synchronization step allows to prevent the measurement beam of the interferometer to reach, at least significantly, the top surface when the image capturing step 104 is carried out. This is important in particular when the image capturing step and the interferometric measurement step are carried out by using respective optical paths that have a common portion.

Such a synchronization may be done in different ways. The synchronization step may be done by:
 controlling a position of a shutter located between the interferometer and the common portion:
  at a first position blocking the passage of the measurement beam, during the image capturing step 104, and
  a second position authorizing the passage of said measurement beam at least during the interferometric measurement step 132;
 controlling a position of a mirror located between the interferometer and the common portion:
  at a first position deflecting the passage of the measurement beam away from the top surface, during the image capturing step 104; and
  a second position deflecting said measurement beam towards the top surface at least during the interferometric measurement step 132;
 controlling a position of an optical density filter or a spectral filter located between the interferometer and the common portion:
  at first position filtering or attenuating most or the measurement beam, during the image capturing step 104; and
  at a second position letting the measurement beam to pass at least during the interferometric measurement step 132;
 controlling an attenuation value of an attenuating device 506 located between the interferometer 410 and the common portion 460 so that:
  the measurement beam doesn't pass, at least significantly, towards the common portion during the image capturing step 104; and
  the measurement beam passes at least during the interferometric measurement step 132;
 switching on and off an interferometer light source so that the measurement beam is not emitted during the image capturing step, and is emitted at least during the interferometric measurement step 132;
 triggering the capturing of image(s) by the imaging arrangement with respect to the pulses of a pulsed light source of the interferometer, or reversely, or synchronizing both, such that the image acquisition is carried out between the pulses of said pulsed source.

Thus, in the method 200 of FIG. 2, the image of the top surface, or at least of the structure, is captured by the imaging arrangement without disturbance by the measurement beam emitted by the interferometer.

Figure 3:
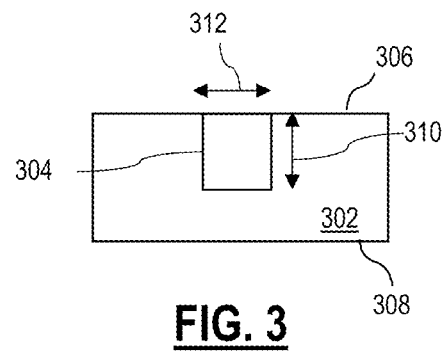
FIG. 3 is diagrammatic representation of a non-limitative example of a structure etched in a substrate that may be characterized according to the present invention.

FIG. 3 illustrates a non-limitative example of a substrate comprising a structure etched in said substrate.

FIG. 3 illustrates a substrate 302, such as a wafer, comprising at one or several structures. For ease of understating only one structure 304 is represented in the FIG. 3. Of course, the substrate 302 may comprise more than one structure. The structure 304 may for example be a trench etched in the substrate 302 from the top surface 306 of the substrate 302. The substrate 302 also comprises a bottom surface 308 opposite to the top surface 306.

The information to be measured on the structure 304 etched is the depth 310 and possibly the top-CD 312. In the example illustrated, the structure 304 may be for instance a hole or a TSV, and the top-CD data 312 may be representative of the diameter at the top surface 306. The structure 304 may also be an elongated trench, and the top-CD 312 may be its smallest transverse dimension, or its width at the top surface 306.

Figure 4:
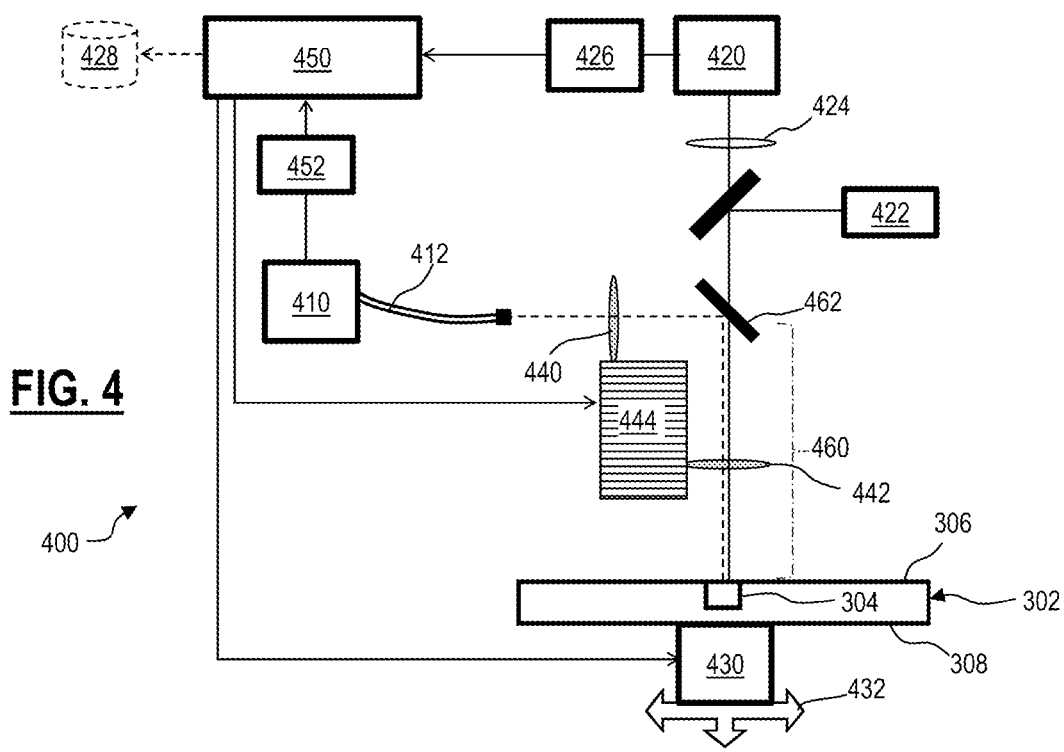
FIGS. 4-6 are diagrammatic representations of non-limitative examples of a system according to the invention.

FIG. 4 is a diagrammatic representation of a non-limitative example of a system according to the present invention.

The system 400, shown in FIG. 4, may be used to characterise structures, and in particular HAR structures etched in a substrate, such as a wafer. More particularly, the system 400 may be used to measure the depth of structures etched in the substrate, and in particular the substrate 302.

The system 400 may be used to carry out a method according to the invention, and especially the method 100 of FIG. 1.

The system 400 comprises a low coherence interferometer 410 placed on the side of top surface 306 of the substrate 302. The low coherence interferometer 410 is used to characterize the structures of the substrate, and in particular to measure at least one data relative to the depth of the structure 304, and even more particularly to measure the depth of the structure 304.

The interferometer 410 may be for instance a time domain interferometer. In that case, it comprises a broadband source (not shown) emitting a polychromatic light. It further comprises an optical delay line which allows varying an optical path difference between two beams. When the optical path difference between the beams reflected respectively at the top and the bottom of the structure 304, or between these respective beams and a reference beam, is reproduced by the delay line, an interference burst, or fringe, can be observed on a photodetector, allowing measuring this optical path difference. The depth of the structure 304 is deducted from said optical path difference.

The interferometer 410 may also be a spectral domain interferometer. In that case, it comprises a broadband source (not shown) emitting a polychromatic light, and a spectrometer for a spectral analysis of the reflected light. The spectrum obtained by combining the light reflected respectively by the top and the bottom of the structure 304 on the spectrometer exhibits well known patterns such as modulations whose analysis can provide the optical path difference between the superposed beams. The depth of the structure 404 is deducted from said optical path difference.

The interferometer 410 may also comprise a swept source interferometer, with a tunable laser emitting a monochromatic light with an optical frequency varying temporally over a spectral range. The intensity of the reflected light is measured by a photodetector, so as to reconstitute a spectrum, whose analysis allows also to measure the optical path difference between the reflected beams, and thus the depth of the structure 304.

The interferometer 410 may be for example similar to the one described in WO 2007/042676.

Optionally but preferably, the measurement beam emitted by the interferometer 410 and the reflected light received from the substrate 302 may be conveyed from and to the interferometer 410 using a single mode fiber 412 coupled to the interferometer 410.

For measuring narrow structures such as TSVs with high aspect ratio (HAR) and diameter smaller than 5 µm, the measurement light source may for example emit light in the visible spectral range, for instance <900 nm, for a better propagation into the structure.

The system 400 further comprises an imaging arrangement for capturing at least one image of the substrate 302, more particularly of the top surface 306 of the substrate 302, and processing said at least one captured image for determining at least one first data relative to at least one HAR structure of the substrate 302.

The imaging arrangement is arranged at the same side as the interferometer 410, i.e. on the side of the top surface 306 of the substrate 302.

In the non-limitative example shown in FIG. 4, the imaging arrangement comprises a camera 420 and, optionally, a light source 422. The imaging arrangement may also comprise a tube lens 424 to image the top surface 306 of the substrate 302 on the camera 420.

The camera 420 is configured to capture/acquire at least one image of the top surface 306 of the substrate 302 comprising at least one structure etched in said substrate 302. The captured image is processed, by standard image processing techniques executed by a processing module 426, for measuring a first data relative to at least one structure, especially at least one HAR structure. The processing module 426 may include a hardware module, such as a processor or a chip, and/or a software module such as a computer program.

For at least one structure, or one HAR structure, the first data may comprise the position of said structure, on the top surface 306. In this case, the position of the structure may be communicated to a control unit to command/control means for adjusting the position of the measurement beam on the top surface 306 of the substrate 302, for accurate positioning of the measurement beam emitted by the interferometer 410 on said structure.

Alternatively, for at least one structure, the position of said structure may be an a priory-known data stored in a memory 428. This data may be read by the control unit in order to command/control the means for adjusting the position of the measurement beam on the top surface 306.

For at least one structure, or one HAR structure, the first data may comprise the top-CD of said structure. In this case, the top-CD of the structure may be communicated to a control unit to command/control means for adjusting the diameter of the measurement beam emitted by the interferometer 410.

Alternatively, for at least one structure, the top-CD of said structure may be an a priory-known data stored in the memory 428. This data may be read by the control unit in order to command/control the means for adjusting the diameter of the measurement beam on the top surface 306.

Optionally, the system 400 may also comprise means for adjusting the position of the interferometric measurement beam emitted by the interferometer 410, on the top surface 306 of the substrate 302, in order to adjust the position of said measurement beam to the position of the structure under inspection.

In the example shown in the FIG. 4, the position adjustment means comprise a holder 430, such as a wafer chuck, associated to displacement means 432, such as translation and/or rotary stages, to move and position the substrate 302 in the X-Y, and optionally Z, directions.

Optionally, the system 400 may also comprise means for adjusting the diameter on the top surface 306 of the substrate 302 of the interferometric measurement beam emitted by the interferometer 410, in order to adjust the diameter of said measurement beam to the structure under inspection.

In the example shown in FIG. 4, the diameter of the measurement beam may be determined by the core of the fiber 412 or the mode field diameter of the light exiting the fiber, and the magnification provided by the combination of a collimator lens 440 and a lens 442, called front side lens, such as a microscope objective. So, at least one of these lenses 440-442 can be changed in order to change the magnification, and thus to adjust the diameter of the measurement beam on the top surface 306.

The system 400 comprises a turret 444 for changing at least one of the lenses 440-442 and/or varying the focal length of one of the lenses 440-442, to change the magnification accordingly.

The system 400 may also comprise a beam expander (not shown) in a section where the measurement beam is collimated, such as between the collimator lens 440 and the front side lens 444. The beam expander modifies the beam diameter and therefore the numerical aperture, NA, with which the beam is focused. This finally defines the diameter of the measurement beam on the top surface 306.

The system 400 also comprises a control unit 450.

The control unit 450 may be arranged for controlling the means for adjusting the position of the measurement beam on the top surface 306 of the substrate as a function of a position data. As explained above, the position data may be:
  provided by the imaging arrangement, and in particular by the processing module 426; or
  read from the memory 428, as an a priory-known data.
More particularly, the control unit 450 may be arranged for controlling the displacement means 432 for moving the holder 430 so that the substrate 302 is moved relatively to the measurement beam. Thus, the position of the measurement beam on the top surface 306 may be adjusted.

Alternatively, or in addition, the control unit 450 may also be arranged for controlling the means for adjusting the diameter of the measurement beam on the top surface 306 of the substrate 302 as a function of a top-CD data. As explained above, the top-CD data may be:
  provided by the imaging arrangement, and in particular by the processing module 426; or
  read from the memory 428, in case said top-CD data is an a priory-known data.
More particularly, the control unit 450 is arranged for controlling the turret 444 for changing at least one of the lenses 440-442 and/or varying the focal length of one of the lenses 440-442, to change the magnification accordingly.

Thus, the diameter of the measurement beam on the top surface 306 may be adjusted in order to obtain a desired diameter for the measurement beam on the top surface 306.

As an alternative, or in addition, the measurement beam diameter, and/or the measurement beam position, on the top surface may also be adjusted as a function of at least one characteristic of the signal measured by the interferometer.

Such an adjustment of the diameter, and/or of the position, of the measurement beam may be done during the interferometric measurement, and allows adjustment of the measurement beam, especially in real condition and in real time, when the measured interferometric signal indicates that the diameter, respectively the position, of the measurement beam is not adapted to the structure 404 that is being measured.

The at least one characteristic of the measured signal that may be used to adjust the diameter, and/or the position, of the measurement beam on the top surface 406 may be, or may comprise, at least one of the following characteristics:
- a visibility or a modulation depth, possibly relative to an average value, of interference fringes or a spectral modulation of the measured interferometric signal;
- an amplitude relative to the noise of the measured interferometric signal; and/or
- a value of depth data as provided by the interferometric signal.

To do this, the interferometer 410 may be configured to, or may comprise (or may be coupled to) a module 452 configured to, measure the value of said characteristic of the measured signal and compare said value to the expected value(s), or previous value(s) in an iterative process. The result of the comparison may be communicated to the control unit 450 for adjustment of the beam diameter, and/or of the beam position, on the top surface 306 as explained above.

As shown in FIG. 4, the interferometer 410 and the imaging arrangement operate with respective optical paths that have a common portion 460. In the example illustrated, this common portion 460 of the optical paths starts at the level of a mirror 462 that:
- reflects the measurement beam coming from the interferometer 410 towards the substrate 302, and the reflected beam coming from the substrate towards the interferometer 410;
- lets pass the imaging light coming from the light source 422 towards the substrate 302, and the reflected imaging light coming from the substrate 302 towards the camera 420;

In the example of FIG. 4, the common portion 460 of the optical paths comprises the front side lens 442.

Figure 5:
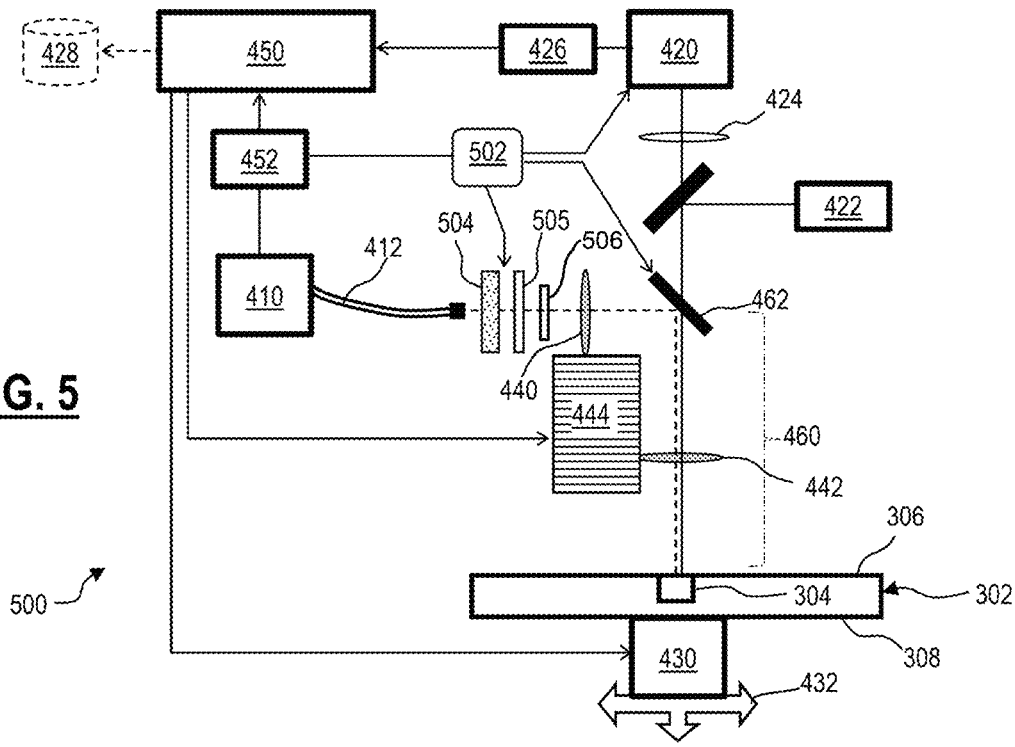

FIG. 5 is a diagrammatic representation of another non-limitative example of a system according to the present invention.

The system 500, shown in FIG. 5, comprises all the components of the system 400 of FIG. 4.

As shown in FIG. 5, and also in FIG. 4, the interferometer 410 and the imaging arrangement operates with a common optical path portion 460. In case the interferometer beam is visible by the camera, it may degrade or even prevent a proper imaging of the structure, due to the non-uniform illumination that it generates, or even cause a blurring of the camera 420. At the same time, the imaging light may disturb the interferometric measurement carried out with the interferometer 410. Thus, it may be advantageous to synchronize the interferometer 410 and the imaging arrangement in order to carry out interferometric measurement(s) and the acquisition of image(s), sequentially or in turn, and more generally not at the same time.

For this purpose, the system 500 comprises a synchronization controller/unit 502, that may be a hardware unit such as a processor, a chip or even a computer, or a software module such as a computer program.

In the example shown, the synchronization controller 502 is configured to trigger the camera 420 between two pulses of a pulsed beam source (not shown) of the interferometer 410, or to trigger the pulsed light source between image acquisitions by the camera, or command both. Thus, the camera 420 captures, or acquires, at least one image when the measurement beam is not emitted by the interferometer 410.

As an alternative, or in addition, the mirror 462 may be controllably movable, and in particular rotary, and the synchronization controller 502 may be configured to command the position of said mirror 462. More particularly, the mirror 462 may be controllably rotary between:
- a first position deflecting the measurement beam away from the structure, or the top surface 306, that is being characterized, and
- a second position directing said measurement beam towards said structure, or top surface 306.

When the imaging step is carried out, the synchronization controller 502 commands the mirror 462 to be in the first position: the measurement beam is deflected away from the structure 304 and the image(s) may be captured by the camera 420. After the imaging step is carried out, the synchronization controller 502 commands the mirror 462 to be in the second position: the measurement beam is directed towards the structure 304: interferometric measurement may be carried out.

Alternatively, or in addition, the system may comprise a controllable shutter 504, placed between the interferometer 410 and the mirror 462 in the example illustrated. The synchronization controller 502 may be configured to command the position of said controllable shutter 504. This shutter 504 may be controllable between:
- a "closed" position blocking the passage of the measurement beam coming from the interferometer 410, and
- an "open" position authorizing the passage of said measurement beam coming from the interferometer 410.

When the imaging step is carried out, the shutter 504 may be commanded to pass into the closed position preventing the passage of the measurement beam. After the imaging step is carried out, the shutter 504 may be commanded to pass to the open position authorizing the passage of the measurement beam so that the interferometric measurement may be carried out.

Alternatively, or in addition, the system may comprise a movable optical filter 505, such as a neutral density or a spectral filter, placed between the interferometer 410 and the mirror 462 in the example illustrated, and mounted for instance in a filter wheel. The synchronization controller 502 may be configured to command the position of said movable optical filter 505 within the filter wheel. The position of that optical filter 501 505 may be controllable between:
- a "closed" position filtering the measurement beam coming from the interferometer 410, and
- an "open" position authorizing the passage of said measurement beam coming from the interferometer 410.

When the imaging step is carried out, the movable optical filter 505 may be positioned to pass into the closed position preventing the passage of the measurement beam. After the imaging step is carried out, the movable optical filter 505 may be commanded to pass to the open position authorizing the passage of the measurement beam so that the interferometric measurement may be carried out.

Of course, other synchronization means may be used instead of or in combination with the synchronization means described with reference to FIG. 5, such as those indicated further above.

Figure 6:
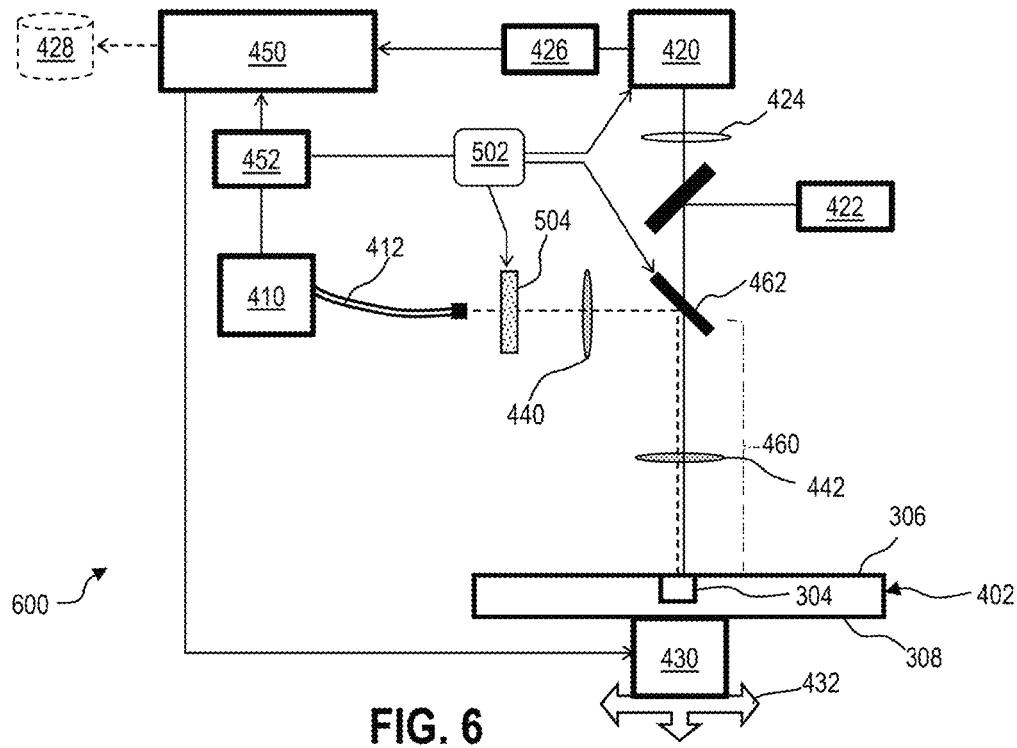

FIG. 6 is a diagrammatic representation of another non-limitative example of a system according to the present invention.

The system 600, shown in FIG. 6, comprises all the components of the system 500 of FIG. 5, except the turret 444.

In the system 600, the diameter of the measurement beam is not adjusted.

The first data provided by the imaging arrangement, and more particularly the processing module 426, relates to the position of the structure 304. The position data is used by the control unit 450 to adjust the position of the measurement beam on the top surface and place the measurement beam accurately on the structure, or the HAR structure, that is being characterized.

The system 600 however may however optionally comprise the synchronization controller 502 controlling the camera 420 with respect to a pulsed source of the interferometer, and/or the mirror 462 and/or the shutter 504, so that image capturing and interferometric measurement are realized in turn.

Of course, the invention is not limited to the examples detailed above.

While a particular embodiment of the present method and a system for combined characterisation of structures etched in a substrate, have been described herein, it will be appreciated by those skilled in the art that changes and modifications may be made thereto without departing from the invention in its broader aspects and as set forth in the following claims.

The invention claimed is:

1. A method for characterising structures etched in a substrate comprising, for at least one structure etched in said substrate:
    an imaging step comprising the following steps:
        capturing, with an imaging device positioned on a top surface of said substrate, at least one image of the top surface of said substrate; and
        measuring a first data relating to said at least one structure from at least one captured image;
    an interferometric measurement step, carried out with a low-coherence interferometer positioned on said top surface, for measuring with a measurement beam positioned on said at least one structure, at least one depth data relating to a depth of said at least one structure; and
    a first adjusting step for adjusting said measurement beam according to said first data,
    said imaging step and said interferometric measurement step being carried out sequentially so that:
        the first data is measured during the imaging step,
        then the measurement beam is adjusted according to said first data, and
        then the interferometric measurement step is carried out with the adjusted measurement beam.

2. The method according to claim 1, characterized in that, the imaging step and the interferometric measurement step are carried out through respective light paths having a common portion, said method also comprising synchronization, by a synchronization unit, of said imaging and interferometric measurement steps so that said steps are carried out sequentially.

3. The method according to claim 1, characterized in that, for the at least one structure, the first data comprises a top critical dimension ("top-CD") data relating to a width of said at least one structure, the first adjusting step comprising an adjustment of a diameter of the measurement beam as a function of said top-CD data.

4. The method according to claim 1, further comprising a second adjusting step for adjusting the diameter of the measurement beam according to at least one characteristic of an interferometric signal measured by the interferometer.

5. The method according to claim 3, characterized in that the diameter of the measurement beam on the top surface is adjusted by changing:
    at least one optical element placed between the interferometer and the top surface;
    at least one focal length of an optical element placed between the interferometer and the top surface; and/or
    a numerical aperture of the measurement beam on the top surface.

6. The method according to claim 1, in that, for the at least one structure, the first data comprises a position data relating to a position of the at least one structure on the top surface, the first adjusting step comprising an adjustment of a position, on said top surface, of the measurement beam according to said position data.

7. The method according to claim 4, further comprising a third adjusting step for adjusting the position of the measurement beam relative to the at least one structure according to at least one characteristic of an interferometric signal measured by the interferometer.

8. The method according to claim 6, characterized in that the position, on the top surface, of the measurement beam is adjusted by:
    moving the interferometer with respect to the substrate; and/or
    moving the substrate with respect to the interferometer.

9. A system for characterising a structure etched in a substrate comprising:
    an imaging arrangement comprising:
        an imaging device, arranged on a top surface of said substrate, for capturing at least one image of the top surface of said substrate; and
        a processing unit for measuring a first data relating to the structure etched in said substrate from at least one captured image;
    a low-coherence interferometer, arranged on said top surface, for measuring with a measurement beam positioned on the structure at least one depth data relating to a depth of said structure; and
    an adjustment unit for adjusting the measurement beam according to said first data which is measured before the measurement beam is adjusted by the adjustment unit, and wherein the low-coherence interferometer measures the at least one depth data relating to the depth of said structure with the adjusted measurement beam.

10. The system according to claim 9, characterized in that, for the structure, the first data comprises a top critical dimension ("top-CD") data relating to a width of said structure, the adjustment unit comprising means for adjusting the diameter, on the top surface, of the measurement beam, wherein the means for adjusting the diameter comprise:

a turret for changing at least one optical element placed on the path of the measurement beam between the interferometer and the top surface;

an optical element with adjustable focal length, placed on the path of the measurement beam between the interferometer and the top surface; and/or a beam expander with adjustable numerical aperture, placed on the path of the measurement beam between the interferometer and the top surface.

11. The system according to claim 9, characterized in that, for the structure, the first data comprises a position data relating to a position of the structure on the top surface, the adjustment unit further comprising a positioning unit for adjusting the position, on the top surface, of the measurement beam.

12. The system according to claim 9, wherein respective light paths of the imaging arrangement and of the interferometer have a common portion, said system also comprising a synchronization unit so that said imaging arrangement and said interferometer are used sequentially.

13. The system according to claim 12, characterized in that the synchronization unit comprises at least one of the following:

a shutter located between the interferometer and the common portion, and moveable between a first position blocking the passage of the measurement beam and a second position authorizing the passage of said measurement beam;

a mirror located between the interferometer and the common portion, and moveable between a first position deflecting the passage of the measurement beam away from the structure and a second position deflecting said measurement beam towards said structure;

an optical filter located between the interferometer and the common portion, and moveable between a first position filtering the measurement beam and a second position letting the measurement beam pass;

an attenuating device located between the interferometer and the common light path portion, the attenuation value of which is controllable;

a controller switching on and off an interferometer light source; and/or a controller controlling the imaging device and/or the light source so as to trigger acquisition of at least one image by the imaging device with respect to the pulses of a pulsed light source of the interferometer such that image acquisition is carried out between the pulses of said source.

* * * * *